(12) United States Patent
Hayashi et al.

(10) Patent No.: US 12,724,949 B2
(45) Date of Patent: Sep. 1, 2026

(54) WORK SUPPORT DEVICE, WORK SUPPORT SYSTEM, AND ANALYSIS PROGRAM

(71) Applicant: Hitachi, Ltd., Tokyo (JP)

(72) Inventors: Shingo Hayashi, Tokyo (JP); Shoji Yamamoto, Tokyo (JP); Takaaki Ueno, Tokyo (JP); Masahiko Niioka, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 892 days.

(21) Appl. No.: 18/099,213

(22) Filed: Jan. 19, 2023

(65) Prior Publication Data

US 2023/0237232 A1 Jul. 27, 2023

(30) Foreign Application Priority Data

Jan. 26, 2022 (JP) ................................ 2022-010111

(51) Int. Cl.
*G06F 30/31* (2020.01)
*G06F 30/39* (2020.01)

(52) U.S. Cl.
CPC ............. *G06F 30/31* (2020.01); *G06F 30/39* (2020.01)

(58) Field of Classification Search
CPC ...................................................... G06F 30/31
USPC ........................................................ 716/102
See application file for complete search history.

(56) References Cited

FOREIGN PATENT DOCUMENTS

| | | | | |
|---|---|---|---|---|
| CN | 109508676 A | 3/2019 | | |
| JP | H09-305106 A | 11/1997 | | |
| JP | 2018-206250 A | 12/2018 | | |
| WO | WO-2023119636 A1 * | 6/2023 | .......... | G06F 30/392 |

OTHER PUBLICATIONS

Taiwan Patent Office, Office Action, Application No. 112102280, dated Jan. 22, 2024, in 6 pages.

* cited by examiner

*Primary Examiner* — Eric D Lee
(74) *Attorney, Agent, or Firm* — PROCOPIO, CORY, HARGREAVES & SAVITCH LLP

(57) ABSTRACT

A work support device according to the invention detects circuit symbols and conducting wires from circuit drawing data that does not have information unique to a circuit part, and by matching the detection result with a result of tracing a conduction path by handwriting by a worker, the circuit part and the conducting wire through which the conduction path passes are specified.

15 Claims, 17 Drawing Sheets

FIG. 2

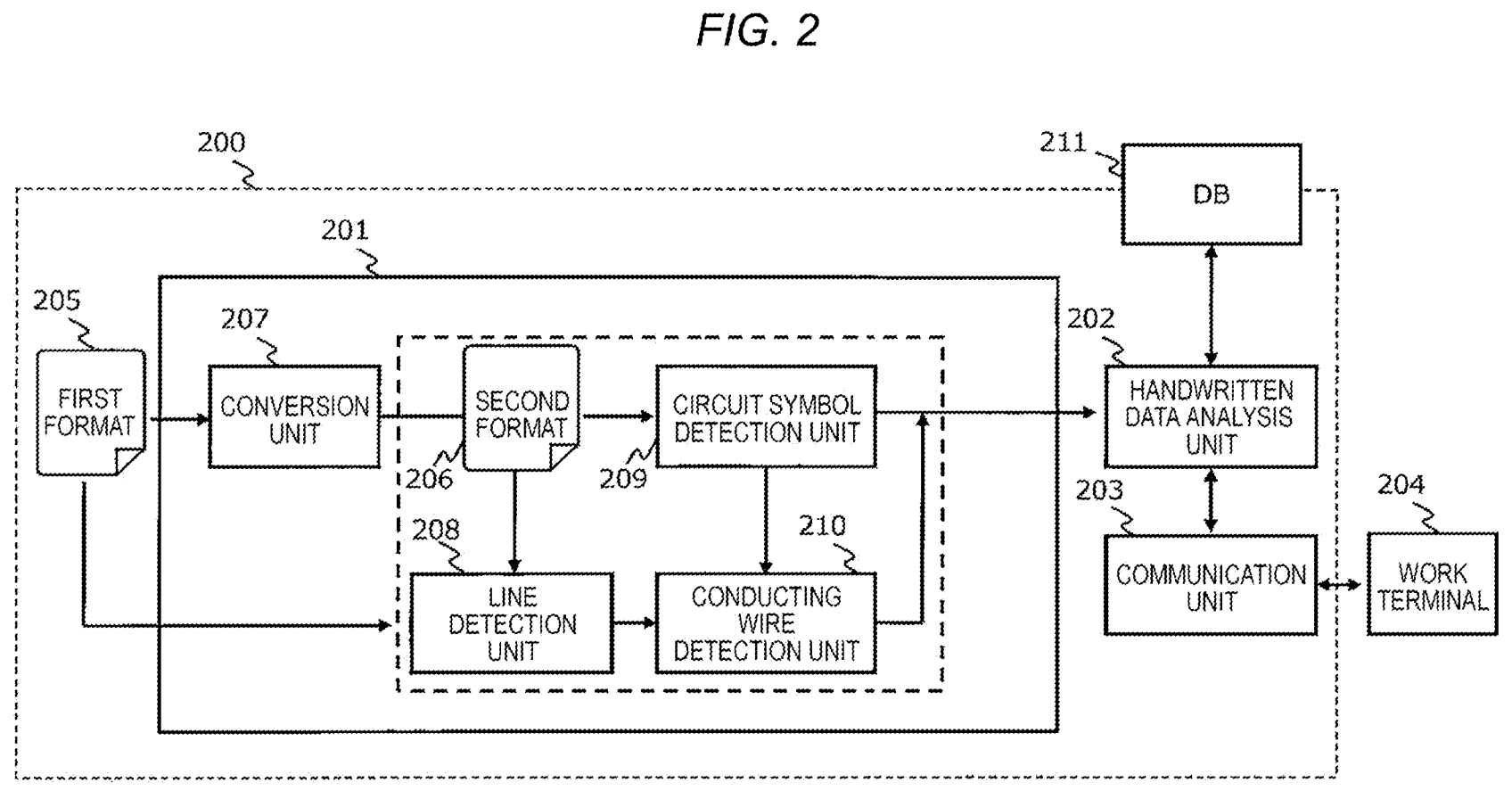

200
201
202 HANDWRITTEN DATA ANALYSIS UNIT
203 COMMUNICATION UNIT
204 WORK TERMINAL
205 FIRST FORMAT
206 SECOND FORMAT
207 CONVERSION UNIT
208 LINE DETECTION UNIT
209 CIRCUIT SYMBOL DETECTION UNIT
210 CONDUCTING WIRE DETECTION UNIT
211 DB

Figure 10:
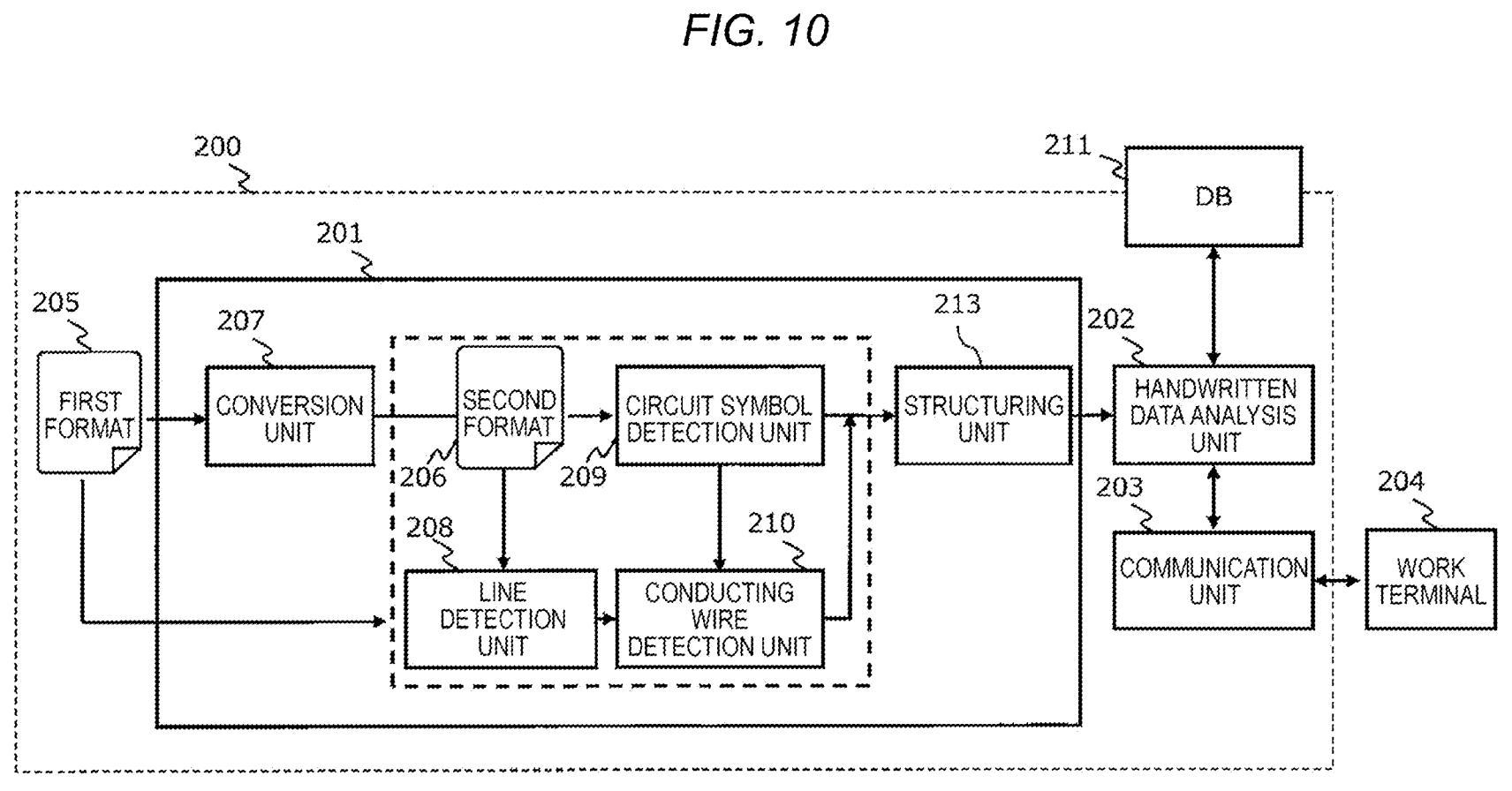

200
201
FIRST FORMAT
205
CONVERSION UNIT
207
SECOND FORMAT
206
LINE DETECTION UNIT
208
CIRCUIT SYMBOL DETECTION UNIT
209
CONDUCTING WIRE DETECTION UNIT
210
STRUCTURING UNIT
213
HANDWRITTEN DATA ANALYSIS UNIT
202
DB
211
COMMUNICATION UNIT
203
WORK TERMINAL
204

FIG. 14

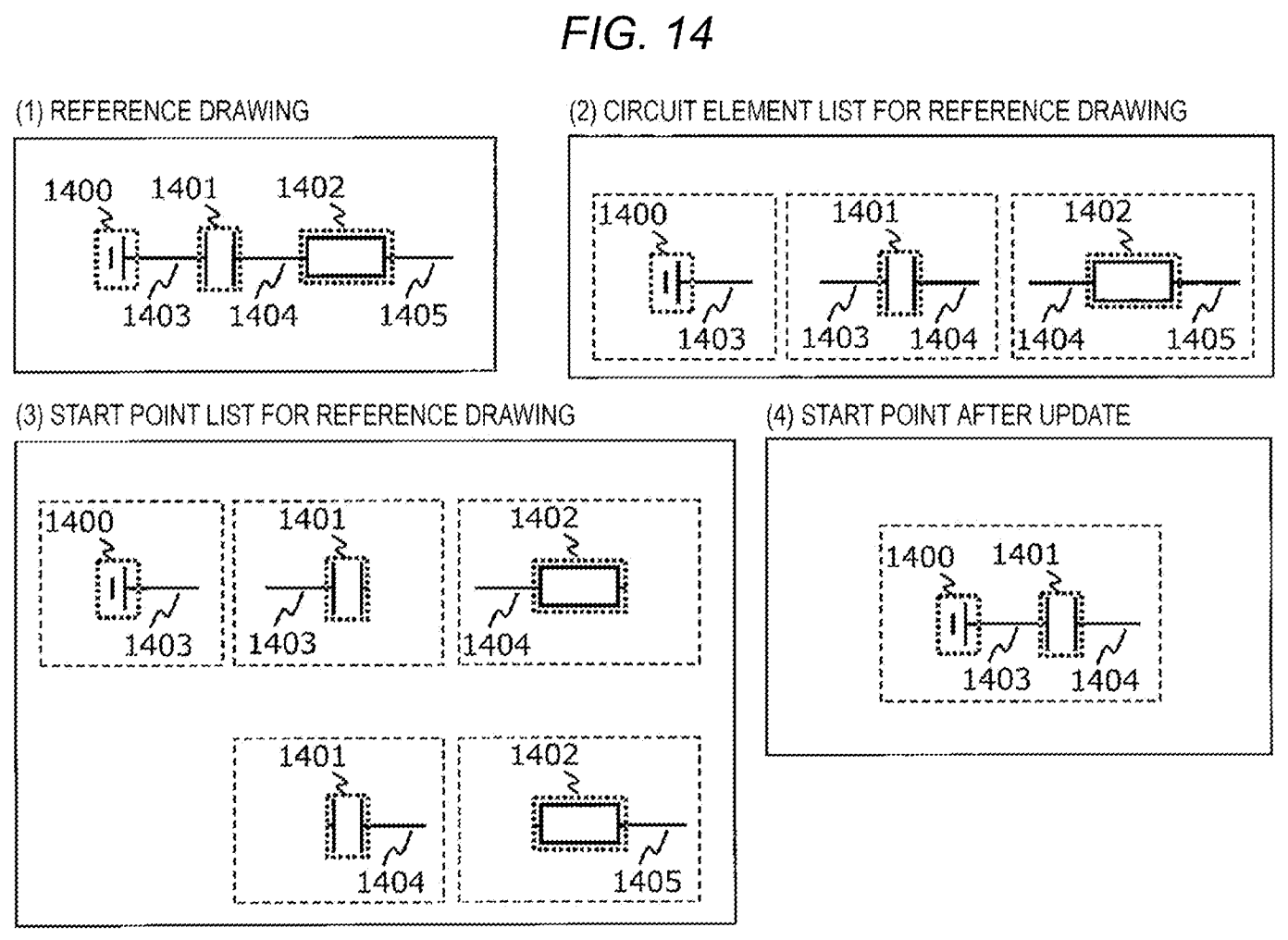

(1) REFERENCE DRAWING 1400 1401 1402 1403 1404 1405

(2) CIRCUIT ELEMENT LIST FOR REFERENCE DRAWING 1400 1403

1401 1403 1404

1402 1404 1405

(3) START POINT LIST FOR REFERENCE DRAWING 1400 1403

1401 1403

1402 1404

1401 1404

1402 1405

(4) START POINT AFTER UPDATE 1400 1401 1403 1404

(1) TWISTED WIRE
1500
1501
1502
1503
1504
(2) CIRCUIT ELEMENT LIST FOR TWISTED WIRE
1500
1501
1502
1503
1504
(3) IC
1505
1506
1507
1508
IC
(4) NO INPUT/OUTPUT RELATIONSHIP
1505
1506
1507
1508
IC
(5) INPUT/OUTPUT RELATIONSHIP (1506 → 1508)
1505
1506
1507
1508
IC

*FIG. 17*

<WORKER TABLE>

| PERSONAL ID | NAME | AFFILIATION | TERMINAL ID | TASK INFORMATION |
|---|---|---|---|---|
| 00001 | TARO HITACHI | OO DEPARTMENT / XX SECTION | A0001 | □□□ |
| 00002 | JIRO HITACHI | OO DEPARTMENT / XX SECTION | A0002 | □□□ |
| 00003 | HANAKO HITACHI | OO DEPARTMENT / XX SECTION | A0003 | □□□ |

<TASK TABLE>

| TASK No. | PROJECT NAME | DUE DATE | MANAGER | PERSON IN CHARGE | PROGRESS RATE |
|---|---|---|---|---|---|
| 001 | A | yy/mm/dd | 00001 | △△△ | 12 % |
| 002 | B | yy/mm/dd | 00001 | △△△ | 60 % |
| 003 | C | yy/mm/dd | 00001 | △△△ | 100 % |

FIG. 18

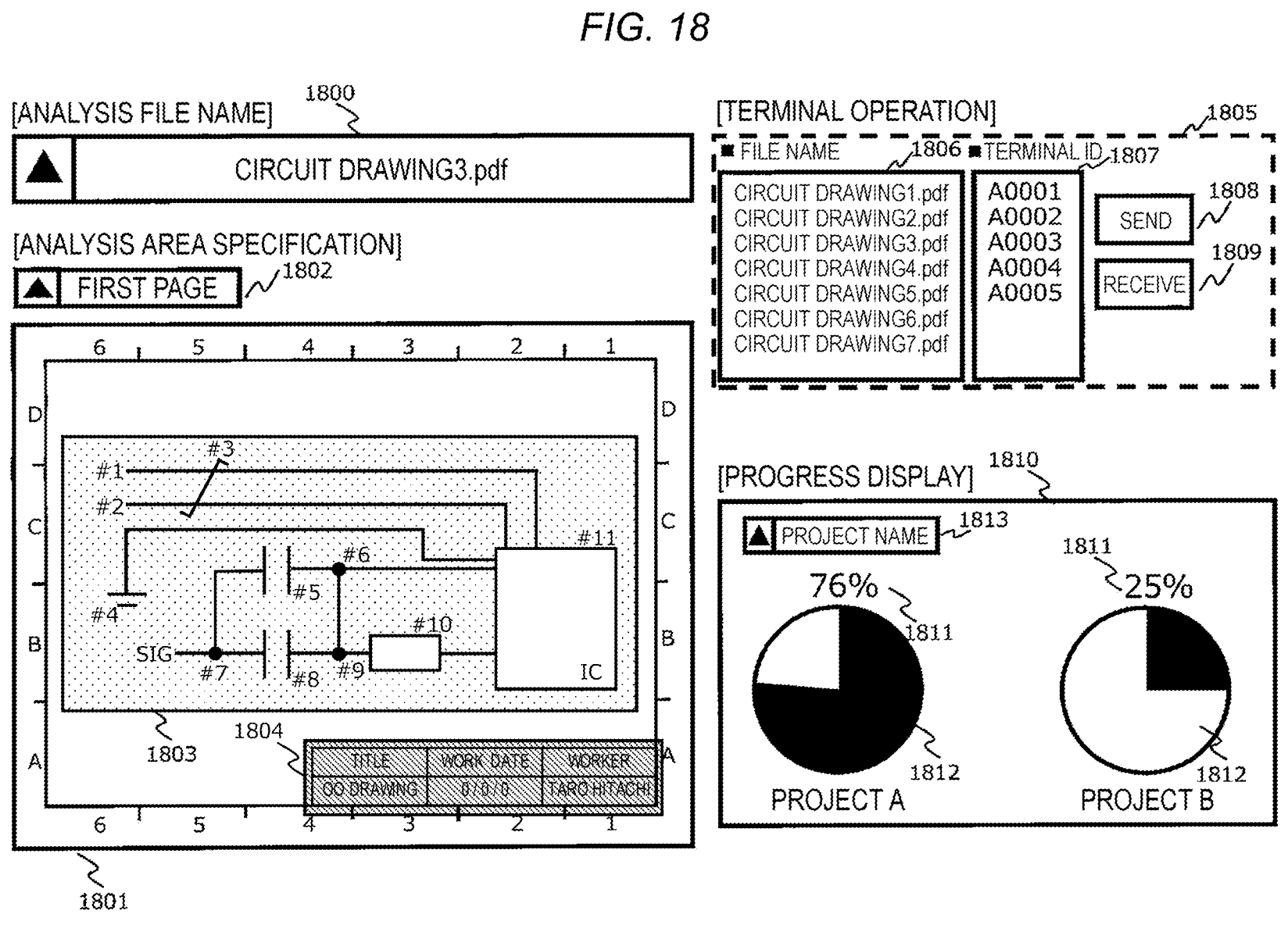

[ANALYSIS FILE NAME]
1800
CIRCUIT DRAWING3.pdf
[ANALYSIS AREA SPECIFICATION]
1802
FIRST PAGE
1801
1803
1804
#1
#2
#3
#4
SIG
#5
#6
#7
#8
#9
#10
#11
IC
TITLE
WORK DATE
WORKER
OO DRAWING
0/0/0
TARO HITACHI
A B C D
1 2 3 4 5 6

[TERMINAL OPERATION]
1805
1806
1807
■ FILE NAME
■ TERMINAL ID
CIRCUIT DRAWING1.pdf
CIRCUIT DRAWING2.pdf
CIRCUIT DRAWING3.pdf
CIRCUIT DRAWING4.pdf
CIRCUIT DRAWING5.pdf
CIRCUIT DRAWING6.pdf
CIRCUIT DRAWING7.pdf
A0001
A0002
A0003
A0004
A0005
1808
SEND
1809
RECEIVE

[PROGRESS DISPLAY]
1810
1813
PROJECT NAME
1811
76%
1812
PROJECT A
1811
25%
1812
PROJECT B

WORK SUPPORT DEVICE, WORK SUPPORT SYSTEM, AND ANALYSIS PROGRAM

BACKGROUND OF THE INVENTION

1. Field of the Invention

The present invention relates to technology for supporting a worker in field work.

2. Description of Related Art

Labor shortage due to population decline, declining birth-rate and aging population is becoming more serious. Especially at manufacturing sites, there is a shortage of skilled workers with high skills, and there is a problem of so-called personalization, in which only specific people can work. In the case of passing on advanced technology, a person who inherits it is also required to have a certain level of skill, but because there is a shortage of mid-career engineers in such a position, the current situation is that technology transfer is not promoting in many companies. In order to promote the transfer of technology to young technicians, it is necessary to create a system that can manualize explicit knowledge such as work procedures and know-how and promote work regardless of skill.

Under these circumstances, a work support system using a wearable terminal such as an electronic paper is attracting attention. For example, in work (so-called vermillion lacquering work) of inspecting a conduction state of a circuit and drawing something over a corresponding part on a drawing, a worker displays a circuit drawing on a terminal screen and traces a circuit part, which has been confirmed to be conductive, on the circuit drawing to record a conduction path. As a result, the conduction path on the circuit drawing is visually indicated by a vermillion lacquered path, so that the conduction path can be visualized. In this way, the use of wearable terminals can provide explicit knowledge that cannot be extracted through paper work of the related art.

A handwritten conduction path recorded by vermilion lacquering records handwritten data of the worker. Since this handwritten data is nothing more than point cloud data, it is not directly connected to circuit parts or conducting wires on the circuit drawing. In order to achieve visualization of the conduction path, which is an original purpose of the vermilion lacquering work, it is necessary to clarify which circuit parts are conducting by collating coordinates of the handwritten data and coordinates of the circuit parts on the circuit drawing.

Data describing a circuit drawing may be described by information (example: type of circuit symbol, identifier, coordinates of figures that form the circuit symbol, and the like) specific to circuit parts in the data, such as CAD drawing data. When a conduction path is recorded by handwriting for data created in such a data format, it is relatively easy to specify a circuit part on a handwritten path. This is because it is sufficient to specify coordinates of the handwritten path and collates the coordinates with coordinates of a figure representing a circuit part.

On the other hand, a wearable terminal used by a worker at a work site may not have a processing capability to display a circuit drawing created in such a data format. In this case, the circuit drawing data is converted to a data format that can be displayed by the terminal and then provided to the terminal. For example, a data format that expresses a figure by pixels, such as raster format data, corresponds to this. When a conduction path is recorded by handwriting on a circuit drawing in such a data format, it is not easy to specify a circuit part on the handwritten path. This is because when the data format is converted, coordinate information of the circuit part is lost and becomes mere pixel information.

JP2018-206250A described below describes a technique for structuring (specifying a connection relationship between components) components on a drawing in raster format. With "To automatically structure a raster format drawing." as an object, this document describes a technique that "A raster format drawing structuring system 10 for converting a raster format drawing 1 into a vector format drawing and structuring the vector format drawing, including a vector conversion function unit 12 for converting a raster format drawing into a vector format drawing, a structuring rule definition DB 15 that defines a rule for a structuring structural element in the vector format drawing, and a structuring function unit 18 that refers to the structuring rule definition DB and assigns attribute information and connection information to the structural element in the vector format drawing to structure the structural element" (see abstract).

With "To easily and accurately create a map from which a route to a destination is easy to understand when creating a route map to the destination." as an object, JPH09-305106A described below describes a technique that "Means for reading a map 1 inputs a map containing a route to show from a scanner, and means for storing a map image 2 stores map information. Means for inputting a coordinate 3 inputs a coordinate and a trajectory from a pen or a tablet, and means for extracting a trajectory 4 extracts the inputted trajectory. Means for detecting a coincidence 5 compares coordinates of road information and input trajectory information to detect coordinates having a coincidence or within an error range. Means for extracting a route 6 extracts map information around a detected point, and means for storing an output image 7 stores the extracted route information. Means for inputting a character 8 adds character information such as a place name to the extracted route information, and means for outputting 10 outputs it to a file or a printer." (see abstract).

In JP2018-206250A, a raster format drawing is converted into a vector format drawing, and then a structural element on the vector format drawing is structured. However, in this document, there is no awareness of a problem of specifying a corresponding relationship between a conduction path handwritten by a worker on a work terminal and a circuit part on the drawing. The same applies to JPH09-305106A as well. Also, in JPH09-305106A, there is no process for converting data into a data format suitable for display by a work terminal. Therefore, there is a need for a technique that can accurately specify a corresponding relationship between a conduction path handwritten in a data format suitable for display by a work terminal and a circuit part on a circuit drawing.

SUMMARY OF THE INVENTION

The invention is made in view of the problems described above, and an object of the invention is to provide technology capable of specifying a conduction path by collating coordinates of handwritten data overlaid on a drawing with coordinates of a circuit part even when a circuit drawing is converted into a data format suitable for display by a work terminal.

A work support device according to the invention detects circuit symbols and conducting wires from circuit drawing data that does not have information unique to a circuit part, and by matching the detection result with a result of tracing a conduction path by handwriting by a worker, the circuit part and the conducting wire through which the conduction path passes are specified.

According to the work support device according to the invention, even when the circuit drawing is converted to a data format suitable for a work terminal, it is possible to specify the conduction path by collating coordinates of the handwritten data overlaid on a drawing with coordinates of the circuit part. Problems, configurations, and effects other than those described above will be clarified by the following description of the embodiments.

BRIEF DESCRIPTION OF THE DRAWINGS

FIG. 2 is a configuration diagram of a work support device according to a first embodiment;

FIG. 9 illustrates an example in which the circuit symbol is surrounded by a dashed line;

FIG. 10 is a configuration diagram of a work support device according to a second embodiment;

FIG. 14 is an example illustrating a structuring procedure executed by the structuring unit;

FIG. 17 illustrates an example of data stored in a DB in the work support device according to a third embodiment; and FIG. 18 is an example of a control screen provided by the work support device.

DESCRIPTION OF EMBODIMENTS

First Embodiment

Figure 1A:
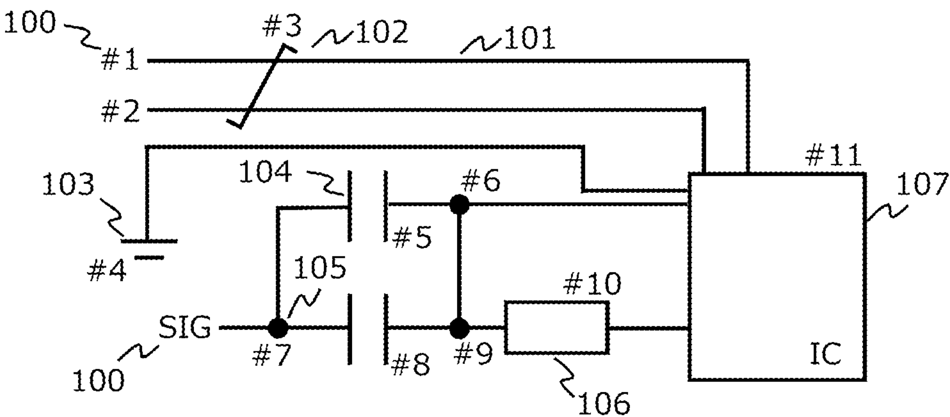
FIG. 1A is an example of a circuit drawing described by circuit drawing data.

FIG. 1A is an example of a circuit drawing described by circuit drawing data. The circuit drawing data is configured to describe circuit components such as circuit parts and conducting wires using geometric information of figures. For example, CAD drawing data in vector format (first data format) corresponds to this. The circuit drawing illustrated in FIG. 1A describes a conducting wire 101, a twisted wire 102, a power source 103, a capacitor 104, a junction 105, a resistor 106, and an IC 107 as circuit components. Attribute information 100 is information expressing attributes of circuit parts by character strings.

Figure 1B:
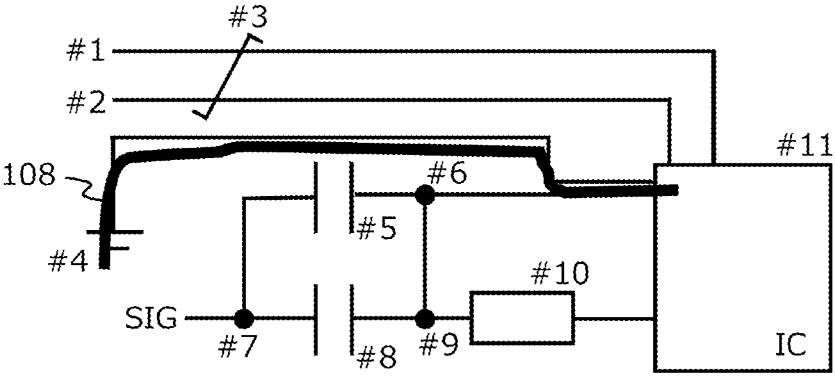
FIG. 1B illustrates a result of a worker's handwriting input of a conduction path to the circuit drawing data.

FIG. 1B illustrates a result of a worker's handwriting input of a conduction path for the circuit drawing data. The worker displays the circuit drawing data on a screen of a work terminal (for example, wearable terminal) and handwrites a path of a circuit part confirmed to be conductive on the circuit drawing. Handwritten data 108 is obtained by tracking handwritten input coordinates, and represents a conduction path input by the worker. Since the handwritten data 108 is given the time when it was written, time-series data of the work means a work procedure.

A purpose of handwriting the conduction path is to visualize connection relationships between the circuit parts that are conducting on the circuit drawing. Therefore, it is necessary to specify the circuit part that the handwritten data 108 traces. However, when the circuit drawing data is converted into a data format (for example, image data or PDF data) suitable for display on the work terminal, coordinate information of circuit parts may be lost. Then, it is not easy to collate the coordinates of the handwritten data 108 with the coordinates of the circuit parts on post-conversion circuit drawing data. A work support device according to the first embodiment of the invention aims to automatically specify the circuit part on the conduction path traced by the handwritten data 108 by providing this collation process.

FIG. 2 is a configuration diagram of a work support device 200 according to a first embodiment. The work support device 200 is a device for converting circuit drawing data 205 created in a first data format (for example, vector format) into circuit drawing data 206 in a second data format (for example, raster format) and providing it to a work terminal 204. The work support device 200 and the work terminal 204 form a system that supports a worker.

The work support device 200 includes a drawing analysis unit 201, a handwritten data analysis unit 202, a communication unit 203, and a database (DB) 211. The drawing analysis unit 201 further includes a conversion unit 207, a line detection unit 208, a circuit symbol detection unit 209, and a conducting wire detection unit 210.

The conversion unit 207 converts the circuit drawing data 205 (first data format) into the circuit drawing data 206 (second data format). The line detection unit 208 detects lines from at least one of the circuit drawing data 205 and the circuit drawing data 206. The circuit symbol detection unit 209 detects circuit symbols described by the circuit drawing data 206. The conducting wire detection unit 210 detects conducting wires described by the circuit drawing data 206. These detection procedures will be described below.

The communication unit 203 transmits the circuit drawing data 206 to the work terminal 204. The work terminal 204 transmits the handwritten data (for example, handwritten data 108) describing the conduction path handwritten by the worker to the circuit drawing data 206 to the work support device 200. The communication unit 203 receives the handwritten data. The handwritten data analysis unit 202 specifies the circuit parts and conducting wires on the conduction path by collating the coordinates of the handwritten data with the coordinates of the circuit parts and the conducting wires detected by the drawing analysis unit 201. The DB 211 stores a processing result by the work support device 200. The DB 211 can be configured by a storage device that stores data.

Figure 3A:
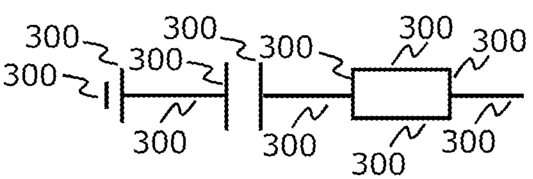
FIG. 3A is a diagram illustrating a result of detection of a line on the circuit drawing data by a line detection unit.
Figure 3A:
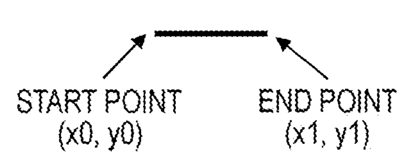

FIG. 3A is a diagram illustrating a result of detection of a line 300 on the circuit drawing data by the line detection unit 208. A detected line can be represented by a start point (x0, y0) and an end point (x1, y1). The line detection unit 208 detects the lines 300 from the circuit drawing data 205 or 206. When the start point and end point of the line 300 are defined on the data, the line 300 may be detected according to that definition. Alternatively, the line 300 may be detected by applying a suitable line detection algorithm, such as a line detection filter, to pixel data.

Figure 3B:
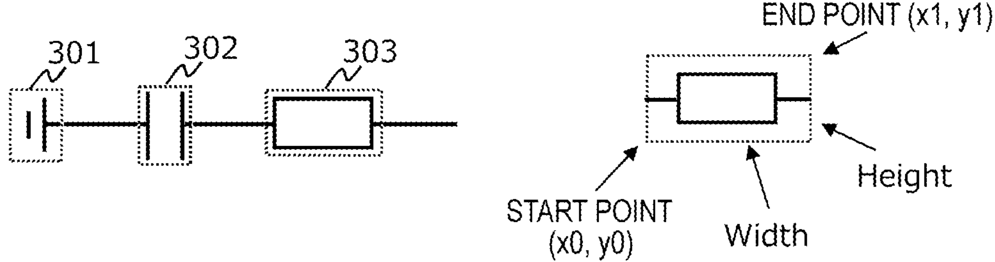
FIG. 3B is a diagram illustrating a result of detection of a circuit symbol on the circuit drawing data by a circuit symbol detection unit.

FIG. 3B is a diagram illustrating a result of detection of a circuit symbol on the circuit drawing data by the circuit symbol detection unit 209. The circuit symbol detection unit 209 detects an area forming a circuit symbol from the lines detected by the line detection unit 208. For example, as described below, template matching or deep learning can be used to detect an area that matches a shape of the circuit symbol. The circuit symbol detected by the circuit symbol detection unit 209 excludes a conducting wire. The coordinates of the detected circuit symbol can be represented, for example, by the lower left (start point) and upper right (end point) of the area. FIG. 3B illustrates an example in which a power source area 301, a capacitor area 302, and a resistor area 303 are detected. Depending on a detection method, some of the conducting wire connected to the circuit symbol may also be recognized as part of the circuit symbol. In this case, the conducting wire can also be treated as part of the circuit symbol.

Figure 3C:
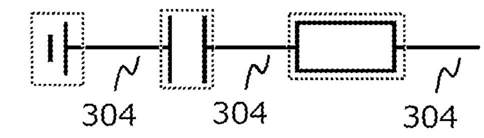
FIG. 3C is a diagram illustrating a result of detection of a conducting wire on the circuit drawing data by a conducting wire detection unit.
Figure 3C:
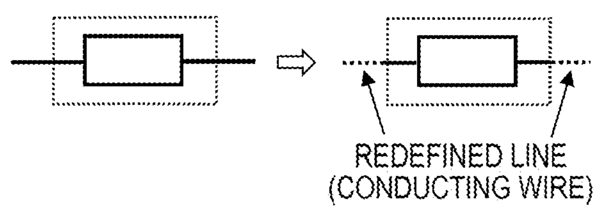

FIG. 3C is a diagram illustrating a result of detection of the conducting wire on the circuit drawing data by the conducting wire detection unit 210. The conducting wire detection unit 210 detects a portion of the line detected by the line detection unit 208 excluding the circuit symbol detected by the circuit symbol detection unit 209 as a conducting wire. Therefore, some of the lines 300 detected by the line detection unit 208 are redefined as conducting wires 304 with new start and end points.

Figure 4:
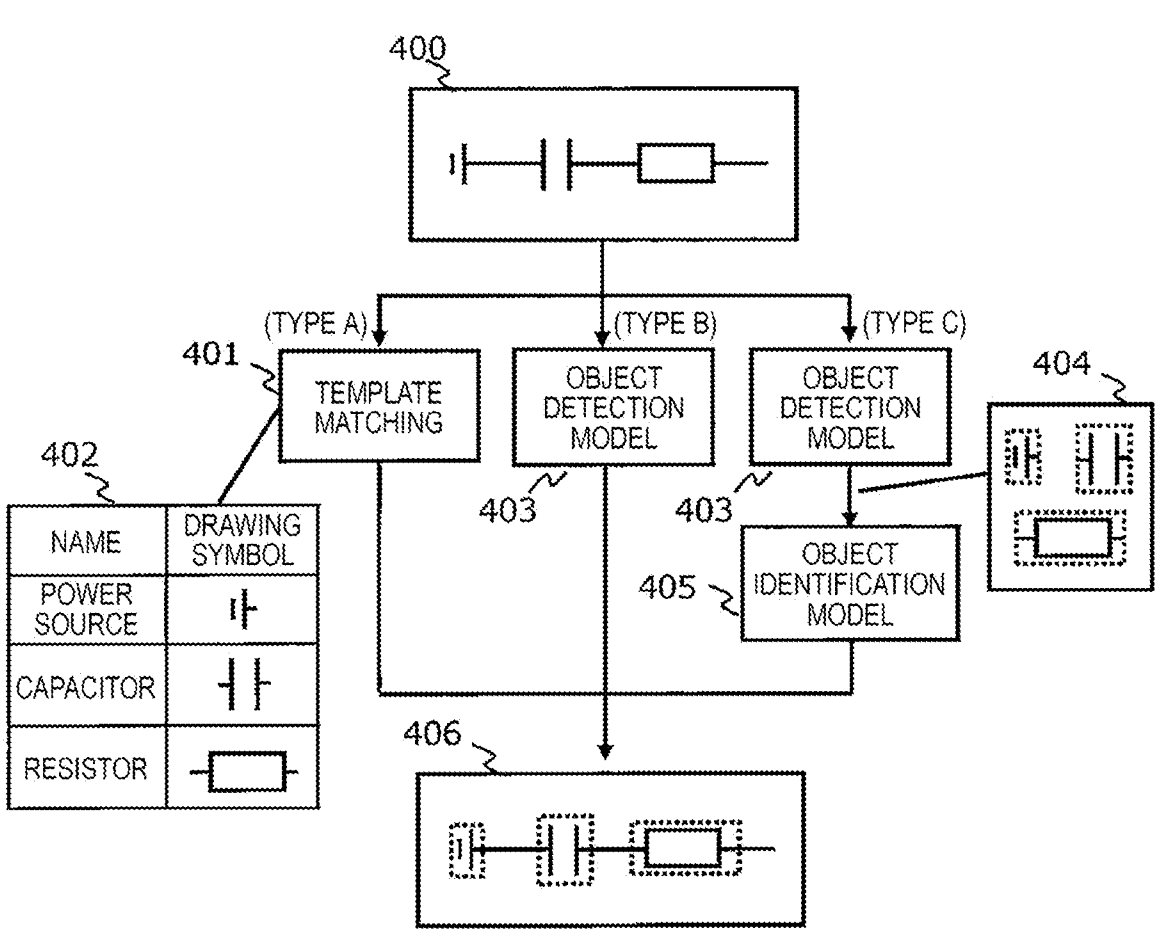
FIG. 4 is a schematic diagram for illustrating a method of detecting the circuit symbol by the circuit symbol detection unit.

FIG. 4 is a schematic diagram for illustrating a method of detecting the circuit symbol by the circuit symbol detection unit 209. The circuit symbol detection unit 209 receives a circuit drawing (input image 400) and applies one or more of the following to it to obtain a circuit symbol detection result 406.

FIG. 4: Template Matching 401: The circuit symbol detection unit 209 detects the circuit symbol by matching a template image 402 and the input image 400. The template image 402 is an image of a circuit symbol that can be included in the circuit drawing data 205 or 206. While template matching is easy to implement, image scaling and rotation can reduce detection accuracy.

FIG. 4: Object Detection Model 403: The circuit symbol detection unit 209 uses object detection models such as Region with CNN features (R-CNN), YOLO, and Single Shot MultiBox Detector (SSD) to detect a circuit symbol with a detector learned through deep learning. Since this method uses a single detection model, false detections can occur when the model is poorly learned.

FIG. 4: Object Detection Model 403+Object Identification Model 405: The circuit symbol detection unit 209 detects the circuit symbol with a detector learned by deep learning using the object detection model 403 and an object identification model 405 such as ResNet, DenseNet, AmoebaNet, and EfficientNet. Specifically, a circuit symbol image 404 detected using the object detection model 403 is input to the object identification model 405. The object identification model 405 identifies types of circuit symbols detected by the object detection model 403. By using the object identification model 405 together, false detections can be excluded, so detection accuracy is improved.

Figure 5:
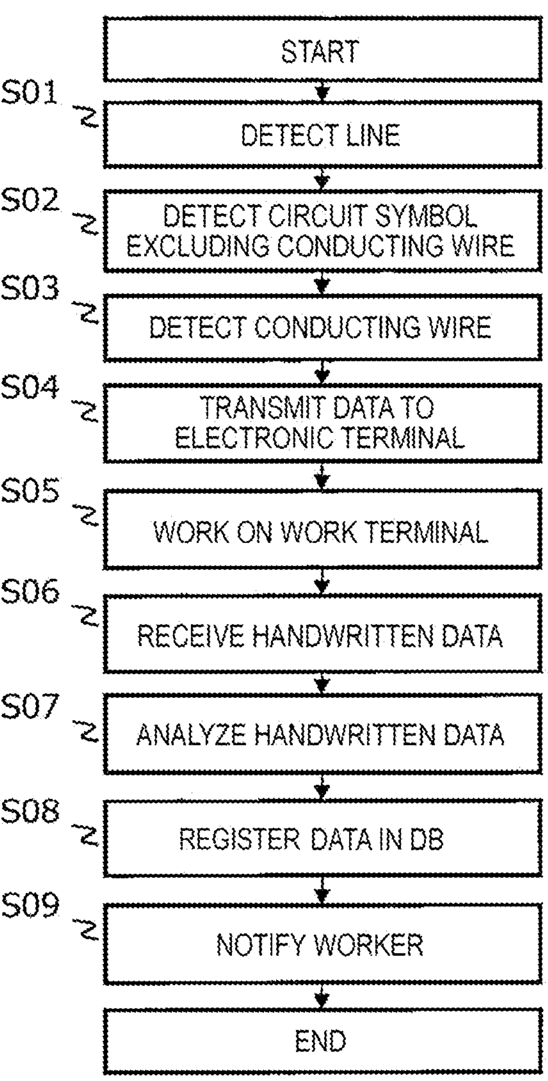
FIG. 5 is a flow chart illustrating an operation of the work support device.

FIG. 5 is a flow chart illustrating an operation of the work support device 200. The work support device 200 starts this flow chart after the conversion unit 207 converts the circuit drawing data 205 into the circuit drawing data 206. The line detection unit 208 detects a line from the circuit drawing data (S01). The circuit symbol detection unit 209 detects a circuit symbol other than a conducting wire from the circuit drawing data (S02). The conducting wire detection unit 210 detects a conducting wire (S03). The communication unit 203 transmits the circuit drawing data 206 to the work terminal 204 (S04). The worker inputs a conduction path on the work terminal 204, and the work terminal 204 transmits handwritten data (S05). The communication unit 203 receives the handwritten data (S07). The handwritten data analysis unit 202 analyzes the handwritten data to specify circuit parts on the conduction path (S07), and stores the result in the database 211 (S08). The handwritten data analysis unit 202 notifies the worker of the analysis result (S09).

Figure 6A:
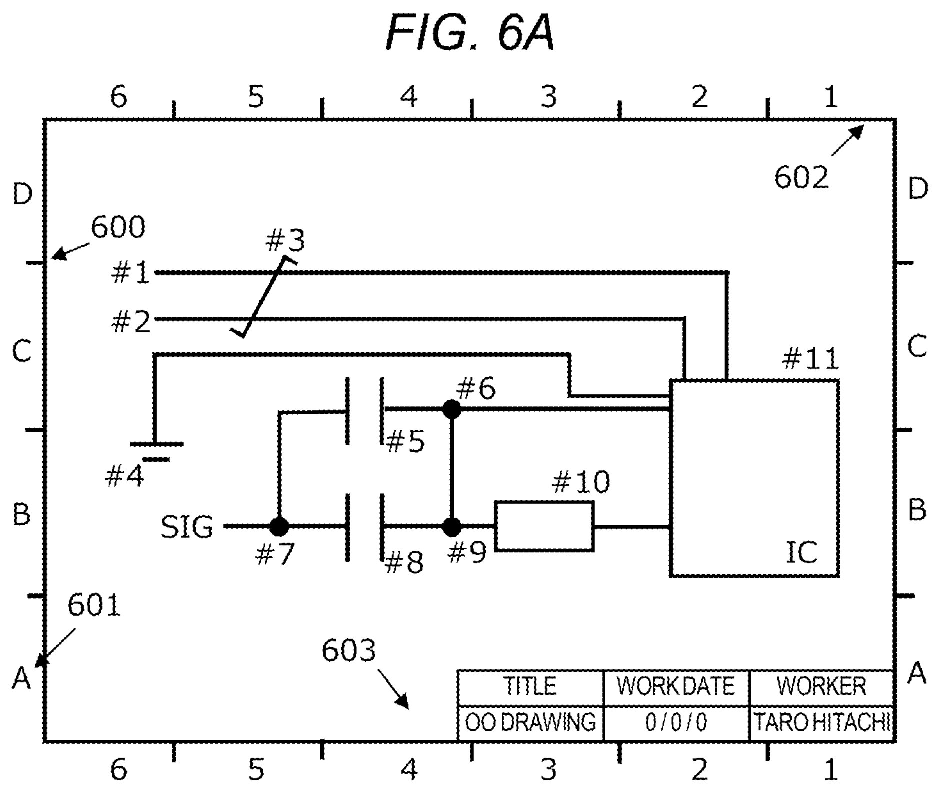
FIG. 6A is an example of the circuit drawing data including information other than the circuit diagram.

FIG. 6A is an example of the circuit drawing data including information other than the circuit diagram. Actual circuit drawing data may describe various information in addition to the circuit diagram. In this example, a grid 600, a grid reference 601, an outline 602, and a title block 603 are described in addition to the circuit diagram. When these pieces of information are also detected by the line detection unit 208, there is a possibility that a portion that is not a conducting wire will be detected as a conducting wire.

Figure 6B:
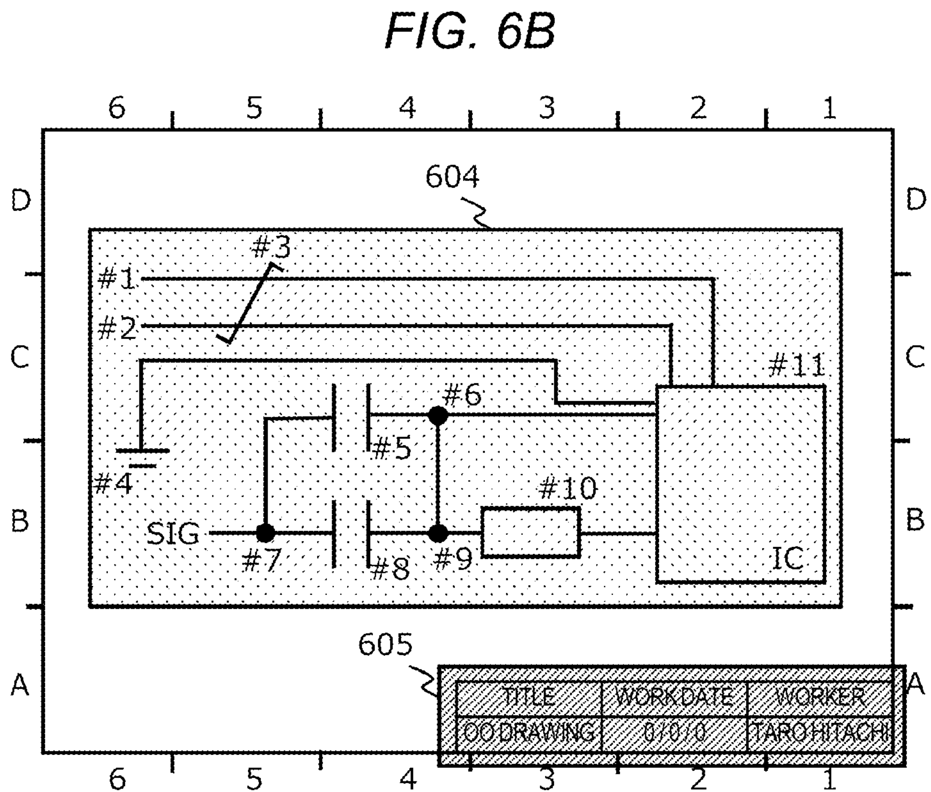
FIG. 6B illustrates an example in which a detection area and a non-detection area are set with respect to FIG. 6A.

FIG. 6B illustrates an example in which a detection area 604 and a non-detection area 605 are set with respect to FIG. 6A. Before the drawing analysis unit 201 detects circuit parts and conducting wires from the circuit drawing data, by excluding information other than the circuit diagram from detection targets, it is possible to avoid erroneously detecting such unnecessary information as part of the circuit diagram. Therefore, the user designates at least one of the area (detection area 604) where the circuit diagram is to be detected and the area (non-detection area 605) where the circuit diagram is not to be detected via an appropriate interface. For example, each area can be designated by the coordinates of a lower left corner and the coordinates of an upper right corner. FIG. 6B illustrates an example in which the title block 603 is designated as the non-detection area 605 and the circuit diagram portion is designated as the detection area 604. The drawing analysis unit 201 detects circuit parts and the like only from the detection area 604 or detects circuit parts and the like only from areas other than the non-detection area 605.

For example, when redundant information (for example, a table describing the characteristics of the circuit symbol) is described inside the circuit symbol, the redundant information should be excluded from a detection target by the line detection unit 208. In this case, the non-detection area 605 is useful. Furthermore, when there are extra ruled lines around the circuit diagram, it is useful to use the detection area 604 together.

Figure 7:
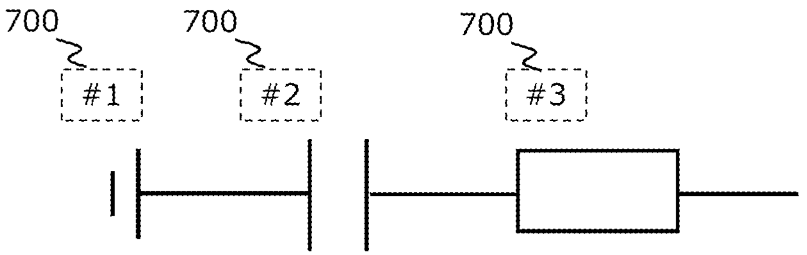
FIG. 7 is a circuit diagram illustrating an example in which attribute information is added to the circuit symbol.

FIG. 7 is a circuit diagram illustrating an example in which attribute information is added to the circuit symbols. The circuit diagram may describe the attribute information along with the circuit parts, such as a part number 700, for example. Such attribute information may also be detected when the circuit symbol detection unit 209 detects a circuit symbol, and the attribute information may be added to the detected circuit symbol. The handwritten data analysis unit 202 may output the attribute information together with the analysis result. This makes it possible to identify the attribute information together with the conduction path.

For example, when a distance between center coordinates of the detected circuit symbol and center coordinates of the character area is within a threshold value, the circuit symbol detection unit 209 treats the character as an attribute of the circuit symbol. As a method for extracting the character area, for example, in the case of circuit drawing data describing character information, the character information may be extracted, or characters may be extracted by applying a method similar to that for circuit symbols to pixels.

Figure 8:
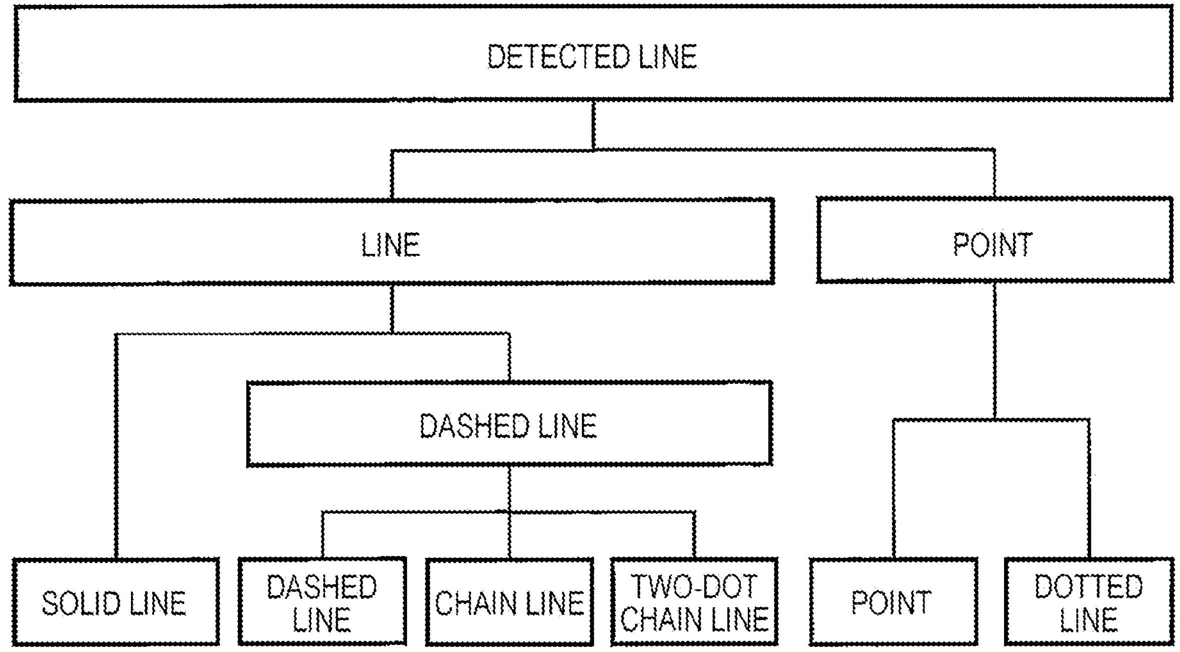
FIG. 8 is a diagram schematically illustrating a procedure for classifying lines detected by a line detection unit by type.

FIG. 8 is a diagram schematically illustrating a procedure for classifying lines detected by the line detection unit 208 by type. The line detection unit 208 reclassifies the line as a point when a length of the detected line is less than a threshold value, and reclassifies it as a line when the length thereof is equal to or greater than the threshold value. As an example of a threshold value for distinguishing between points and lines, it may be set to the extent that a dotted line created by drawing creation software can be recognized as a point, for example. The line detection unit 208 further reclassifies two adjacent collinear lines as a dashed line when a gap between them is less than a threshold value and as a solid line when the gap is equal to or greater than the threshold value. The line detection unit 208 further reclassifies the line types according to the number of points between two lines classified as dashed lines. When the number of points is zero, the line is a dashed line, when the number is one, the line is a one-dot chain line, and when the number is two, the line is a two-dot chain line. The line detection unit 208 further reclassifies two collinear points as a dotted line when a gap between them is less than a threshold value, and reclassifies them as points when the gap is equal to or greater than the threshold value. As each threshold value in the above, an appropriate value may be determined for each step, and the same threshold value need not be used.

Figure 9:
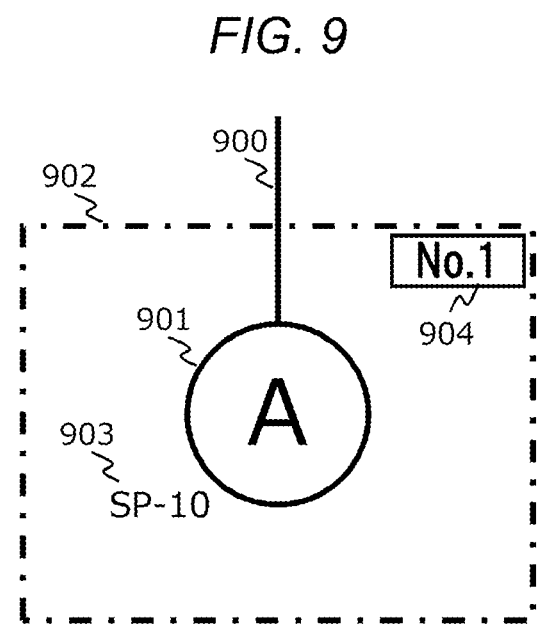

FIG. 9 illustrates an example in which the circuit symbol is surrounded by a dashed line. A circuit drawing may enclose reference information with dotted or dashed lines to make it easier for a reader to understand. In FIG. 9, a conducting wire 900 and an ammeter 901 are connected, the ammeter 901 is surrounded by a one-dot chain line 902, and a model number 903 and a location number 904 are arranged inside the one-dot chain line 902. A character surrounded by a specific type of line in this way can be used as attribute information of a circuit symbol.

When a circuit symbol and a character exist in an area surrounded by dotted or dashed lines, and the character is placed within a predetermined distance from the circuit symbol, the circuit symbol detection unit 209 treats the character as an attribute of the circuit symbol. The predetermined distance between the circuit symbol and the character in this case does not necessarily have to be the same as a distance threshold value in the case described with reference to FIG. 7. This is because, by enclosing a circuit symbol and a character, it is presumed that the character is an attribute of the circuit symbol.

Second Embodiment

FIG. 10 is a configuration diagram of the work support device 200 according to a second embodiment of the invention. The work support device 200 according to the second embodiment includes a structuring unit 213 in addition to the configuration described in the first embodiment. Other configurations are the same as those of the first embodiment. The structuring unit 213 creates data describing a connection relationship between the circuit symbol described by the circuit drawing data 206 and the conducting wire. This process is called structuring. A specific procedure for structuring will be described below.

Figure 11:
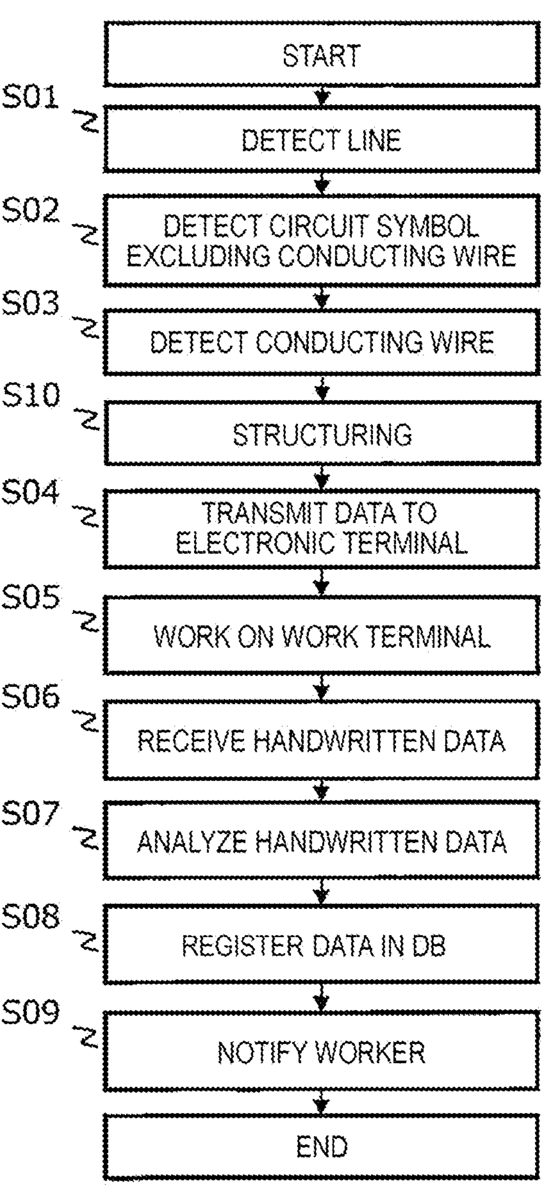
FIG. 11 is a flow chart for illustrating an operation of the work support device according to the second embodiment.

FIG. 11 is a flow chart for illustrating an operation of the work support device 200 according to the second embodiment. Between S03 and S04, the structuring unit 213 executes structuring according to a procedure described below (S10). Other steps are the same as in FIG. 5. However, in S07, the handwritten data analysis unit 202 may use a result of structuring by the structuring unit 213 to specify the conduction path of the handwritten data. For example, by comparing a connection relationship between circuit parts and conducting wires described in the structuring result with a connection relationship indicated by the matching result, it is possible to output a list of the circuit parts and conducting wires through which the conduction path passes.

Figure 12:
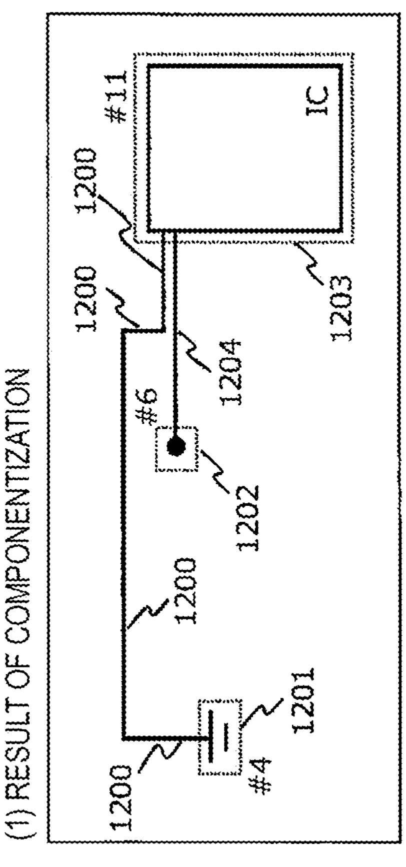
FIG. 12 is an example of a circuit diagram in which one conducting wire is formed of a plurality of wires.
Figure 12:
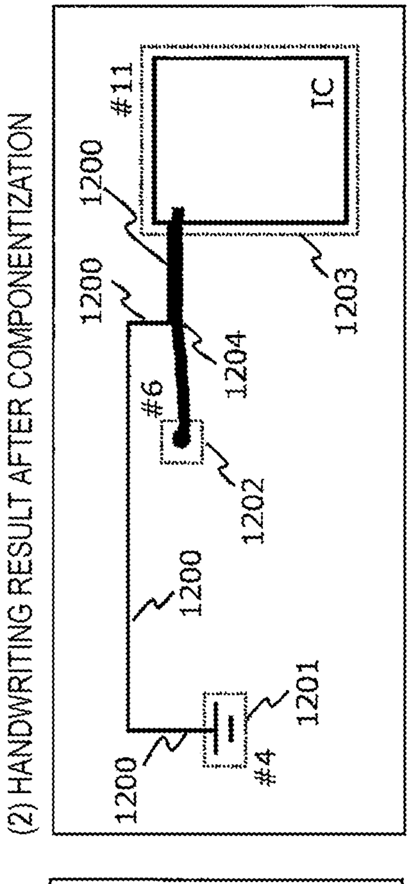
Figure 12:
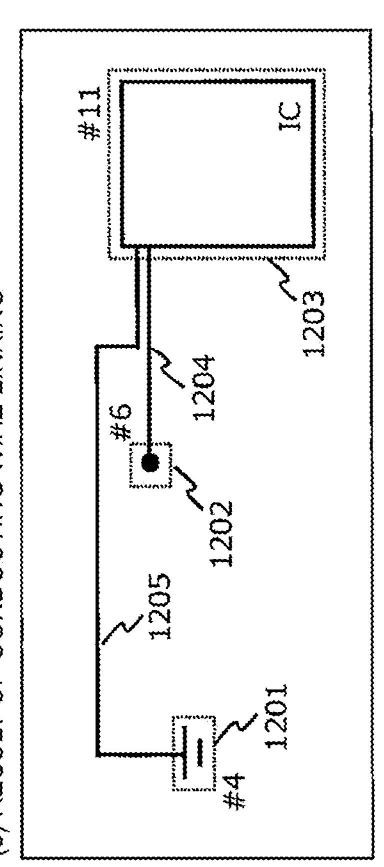

FIG. 12 is an example of a circuit diagram in which one conducting wire is formed of a plurality of wires. In (1) of FIG. 12, a conducting wire 1200 connecting between a power source 1201 and an IC 1203 is formed of four lines, and at least two of these lines are oriented in different directions and meet at their ends to form one conduction path. In addition, between a junction 1202 and the IC 1203, a conducting wire 1204 is arranged adjacent to a fourth line of the conducting wire 1200.

When a conduction path nearby which another conducting wire exists is marked by handwriting as illustrated in (2) of FIG. 12, the handwritten path may overlap another conducting wire. In the example of (2) of FIG. 12, the handwritten path follows both the fourth partial conducting wire of the conducting wire 1200 and the conducting wire 1204. Therefore, there is a possibility that the conduction path cannot be determined correctly.

Therefore, the conducting wire detection unit 210 integrates the four partial conducting wires forming the conducting wire 1200 and treats them as one conducting wire 1205 ((3) of FIG. 12). As a result, even when part of the conducting wire 1205 and the conducting wire 1204 overlap on the handwritten path ((4) of FIG. 12), the handwritten path traces only part of the conducting wire 1205, so the handwritten data analysis unit 202 can determine that this handwritten path does not follow the conducting wire 1205. The conducting wire detection unit 210 may execute such conducting wire integration in advance in S03 of FIG. 11, for example.

Figure 13:
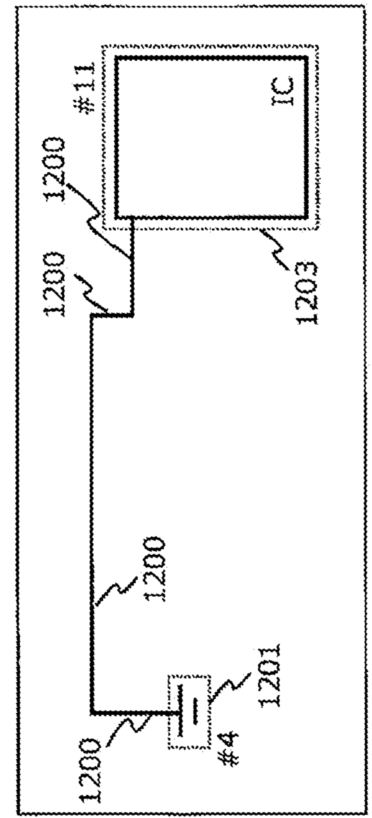
FIG. 13 is a schematic diagram illustrating an example of structuring by a structuring unit.

FIG. 13 is a schematic diagram illustrating an example of structuring by the structuring unit 213. In the circuit diagram on the left side of FIG. 13, the path between the power source 1201 and the IC 1203 can be described as illustrated on the right side of FIG. 13. That is, this path can be described as a path in which circuit symbols 1300 and a conducting wire 1301 are alternately connected. According to this principle, the structuring unit 213 uses a data structure in which the circuit symbols and conducting wire are alternately connected to express a connection relationship described by the circuit drawing data.

FIG. 14 is an example for illustrating a structuring procedure executed by the structuring unit 213. Here, as illustrated in (1) of FIG. 14, when power source 1400=>conducting wire 1403=>capacitor 1401=>conducting wire 1404=>resistor 1402=>conducting wire 1405 are connected in series in this order, a procedure for creating (that is, structuring (1) of FIG. 14) data representing this connection relationship will be described.

The structuring unit 213 enumerates the circuit elements formed by the circuit symbols in the circuit drawing data and the conducting wires connected to the circuit symbols. For example, since the conducting wire 1403 is connected to the power source 1400, these sets are enumerated as one circuit element. Similarly, since the conducting wire 1403 and the conducting wire 1404 are connected to the capacitor 1401, these sets are enumerated as one circuit element. By this procedure, the circuit element list illustrated in (2) of FIG. 14 is created.

The structuring unit 213 enumerates circuit elements in the circuit element list that can be the start points of the connection path. Specifically, the connection relationship in which the circuit symbol and the conducting wire are connected 1:1 is extracted from the circuit element list and enumerated. As illustrated in (3) of FIG. 14, at the start time of structuring, only a set of the power source 1400 and the conducting wire 1403 has a 1:1 connection between the circuit symbol and the conducting wire. Therefore, at this time point, these are the start point elements having the connection relationship.

The structuring unit 213 compares the start element with each circuit element in the circuit element list. The structuring unit 213 specifies from the circuit element list those that have the same conducting wire as that of the start point element and do not have the same circuit symbol as the start point element. At this time point, a set of capacitor 1401/conducting wire 1403/conducting wire 1404 corresponds to this.

The structuring unit 213 connects the specified circuit element list and the start point element by a conducting wire common between them. At this time point, the conducting wire 1403 is common, so the start point element and the capacitor 1401 are connected by the conducting wire 1403. The connected result is updated as a new start point element. As a result, the start point element becomes as illustrated in (4) of FIG. 14. The structuring unit 213 repeats the same process using the new start point element. The structuring unit 213 stores the contents of the start point element at the time point when the start point element cannot be updated as a result of structuring in the DB 211.

Figure 15:
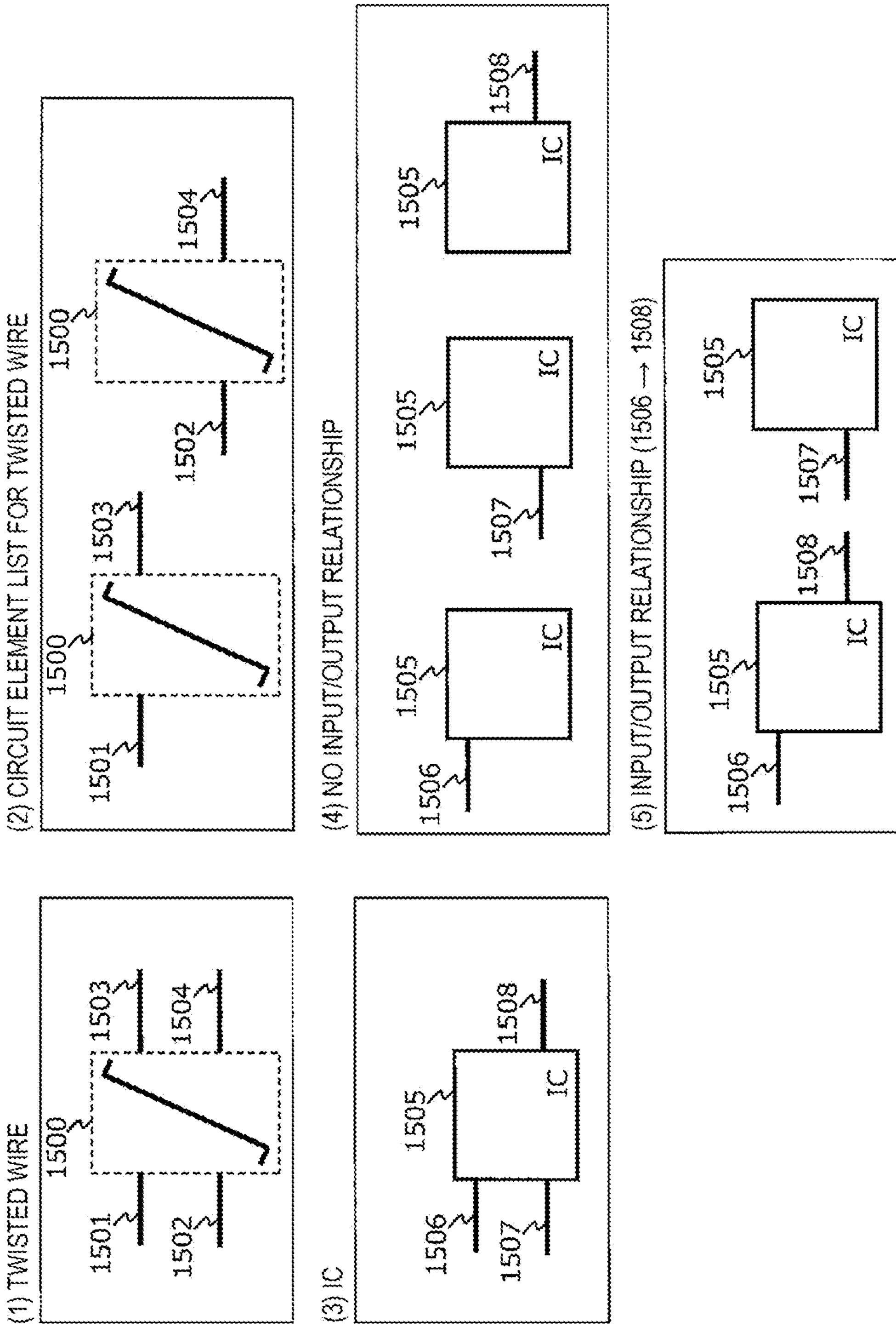
FIG. 15 is an example in which a conducting wire connected to one circuit symbol forms a plurality of input/output relationships.

FIG. 15 is an example in which a conducting wire connected to one circuit symbol forms a plurality of input/output relationships. In this case, the structuring unit 213 enumerates circuit elements for each input/output relationship when creating the circuit element list described with reference to FIG. 14. As a result, even when a plurality of input/output relationships are formed for one circuit symbol, all connection paths based on those input/output relationships can be covered. The input/output relationship for each circuit symbol may be stored in advance by the circuit symbol detection unit 209 together with the type of circuit symbol, for example.

In (1) of FIG. 15, a twisted wire 1500 has the following input/output relationships: (a) receive input from conducting wire 1501 and output from conducting wire 1503; (b) receive input from conducting wire 1502 and output from conducting wire 1504. The structuring unit 213 enumerates these two input/output relationships as individual circuit elements. Therefore, the twisted wire 1500 is enumerated as two circuit elements as illustrated in (2) of FIG. 15.

In (3) of FIG. 15, an IC 1505 has two input conducting wires 1506 and 1507 and one output conducting wire 1508. When there is no input/output relationship between them, the structuring unit 213 enumerates the IC 1505 as an individual circuit element for each conducting wire. Therefore, as illustrated in (4) of FIG. 15, the IC 1505 is enumerated as three circuit elements. Alternatively, for example, when the conducting wire 1506 is an input wire and the conducting wire 1508 is an output wire, and the conducting wire 1507 has no corresponding output wire, as illustrated in (5) of FIG. 15, the IC 1505 will be enumerated as two circuit elements.

Figure 16:
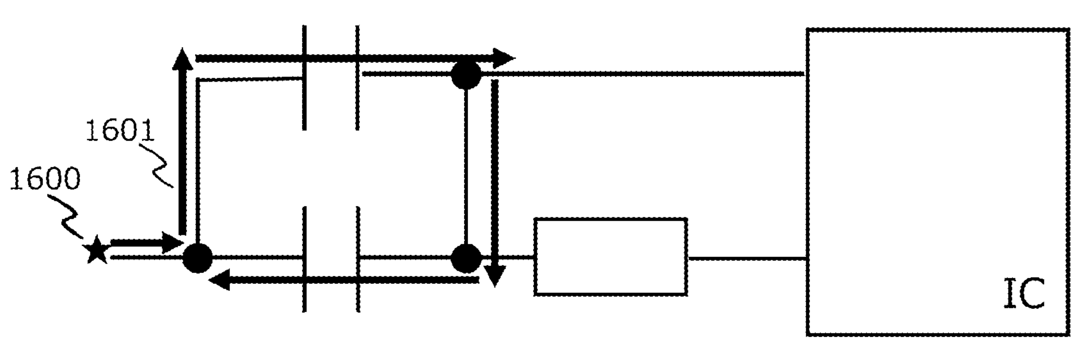
FIG. 16 illustrates an example in which a loop path is formed as a result of structuring by the structuring unit.

FIG. 16 illustrates an example in which a loop path is formed as a result of structuring by the structuring unit 213. In the example illustrated in FIG. 16, a path starting at a start point 1600 is circulated in a loop path 1601. When such a loop path is formed, the same circuit symbol appears multiple times in the connection relationship obtained by structuring. The structuring unit 213 deletes connection paths including such a loop path from the structuring result. This is because such a route cannot be treated as a conducting path.

Third Embodiment

In a third embodiment of the invention, a specific example of data stored in the DB 211 and a user interface provided by the work support device 200 will be described. Other configurations are the same as those of the first and second embodiments.

FIG. 17 illustrates an example of data stored in the DB 211 in the work support device 200 according to the third embodiment. In addition to the results of analysis by the handwritten data analysis unit 202 and other functional units, the DB 211 can store, for example, (a) a worker table describing information on workers, (b) a task table describing information on the work performed by the worker, and the like.

The worker table can store, for example, worker's individual ID, name, affiliation, ID of work terminal to be used, information (task information) for identifying work to be executed, and the like. Task information refers to the task table. For example, the task table can store task No., project name, due date, manager, person in charge, progress rate, and the like. The progress rate represents a progress rate of handwriting input work. The handwritten data analysis unit 202 can calculate the progress rate by, for example, (a) the ratio of conduction paths that have been handwritten-input to all conduction paths described by circuit drawing data, (b) the ratio of circuit parts that have been handwritten-input to all circuit parts described by circuit drawing data, and the like.

FIG. 18 is an example of a control screen provided by the work support device 200. The control screen can be used, for example, by a manager who manages workers to manage the work progress of each worker. A control screen can be provided by the handwritten data analysis unit 202, for example. The control screen has an analysis file designation section 1800, an analysis area designation section 1801, a terminal operation section 1805, and a progress display section 1810.

In the analysis file designation section 1800, when a user (for example, manager) presses a ▲ button, a file selection screen is displayed. The user selects circuit drawing data created by drawing creation software or a PDF file of a circuit drawing. The conversion unit 207 converts the selected data into a data format (circuit drawing data 206) suitable for display by the work terminal 204.

The user designates the page number of the circuit drawing data using a page designation section 1802. The analysis area designation section 1801 displays the circuit drawing described in the page selected by the user. The user designates the detection area 1803 and the non-detection area 1804 by dragging a mouse, for example. A storage device (for example, DB 221) stores detection area data describing the result.

In the terminal operation section 1805, a file selection area 1806 displays a list of circuit drawing data 206. The user designates one of them. A terminal selection area 1807 displays a list of work terminals 204. The user designates a destination terminal to which the circuit drawing data 206 is to be transmitted or a source terminal from which the handwritten data is to be received, and presses a send button 1808 or a receive button 1809. The communication unit 203 transmits the circuit drawing data 205 or the circuit drawing data 206 to a designated destination, or receives handwritten data from a designated source.

The progress display portion 1810 displays a numerical value 1811 of a work progress rate or a circle chart 1812 according to the content of the handwritten data. A display content changing section 1813 can switch the display content, for example, for each project/worker.

In addition to the above, the control screen may display processing results by the drawing analysis unit 201 or the handwritten data analysis unit 202. For example, structuring results, matching results between structuring results and handwritten data, attribute information of circuit symbols, and the like may be displayed. Further, similar contents may be presented to the user in an appropriate data format in place of or in combination with these pieces of information and the screen display of the control screen.

Modification Example of Invention

The invention is not limited to the embodiments described above, and includes various modification examples. For example, the above-described embodiments are described in detail in order to explain the invention in an easy-to-understand manner, and are not necessarily limited to those having all the configurations described. Also, part of the configuration of one embodiment can be replaced with the configuration of another embodiment, and the configuration of another embodiment can be added to the configuration of one embodiment. Moreover, it is possible to add, delete, or replace part of the configuration of each embodiment with another configuration.

In the embodiments described above, the line detection unit 208 is assumed to detect straight lines described by the circuit drawing data, but any suitable curved-line detection technique may be used to detect curved lines. Since the circuit symbol detection unit 209 uses a method such as pattern matching that does not rely solely on line detection, even when the line detection unit 208 detects only straight lines, the circuit symbol may include curved lines.

In the embodiments described above, what the work support device 200 transmits to the work terminal 204 is a data format suitable for the work terminal 204 to display. Either the circuit drawing data 205 or the circuit drawing data 206 may be transmitted when the work terminal 204 is suitable for display it. In either case, it is assumed that in the circuit drawing data received by the work terminal 204, the circuit parts are described as simple figures (geometric information of lines or pixels), and information unique to circuit parts is lost.

Depending on how the circuit diagram is written, a conducting wire may also be treated as a type of circuit symbol. However, in the above embodiments, the circuit symbol and the conducting wire are distinguished from each other, and the circuit symbol is the remainder of the line excluding the conducting wire.

In the above embodiments, the drawing analysis unit 201 (and each functional unit in the drawing analysis unit 201) and the handwritten data analysis unit 202 may be configured by hardware such as a circuit device that implements these functions, or may be configured by an arithmetic device such as a central processing unit (CPU) executing software that implements these functions.

In the embodiments described above, it is described that the drawing analysis unit 201 includes the conversion unit 207, the line detection unit 208, the circuit symbol detection unit 209, and the conducting wire detection unit 210. However, these functional units may be implemented as separate components.

In the above embodiments, the handwritten data analysis unit 202, the drawing analysis unit 201, and the functional units provided in the drawing analysis unit 201 may all be provided on the same device, or some of them may be implemented on another device. For example, the drawing analysis unit 201 (analysis program) may be provided on another device and the process (may include further structuring processing) of detecting circuit parts and conducting wires from circuit drawing data may be performed separately from the handwritten data analysis unit 202.

What is claimed is:

1. A work support device that provides circuit drawing data showing a connection relationship of circuit parts to a work terminal used by a worker, the device comprising:

a conversion unit for converting first circuit drawing data created in a first data format into second circuit drawing data created in a second data format, the first data format being configured to represent, by geometric information, a line that forms a figure describing a respective circuit part of the circuit parts, and the second data format being configured to represent a figure describing a respective circuit part of the circuit parts by a pixel;

a line detection unit for detecting one or more straight lines described by the first circuit drawing data or detecting one or more straight lines from an image area of the second circuit drawing data;

a circuit symbol detection unit for detecting a circuit symbol excluding a conducting wire from the image area of the second circuit drawing data;

a conducting wire detection unit for detecting, as a conducting wire, a remainder after excluding the circuit symbol detected by the circuit symbol detection unit from the straight line detected by the line detection unit;

a communication unit for transmitting the first or second circuit drawing data to the work terminal; and an analysis unit for analyzing conduction path data describing a result of tracing a conduction path on the first or second circuit drawing data with a line input manually by an operator on the work terminal, wherein the analysis unit specifies the circuit part and the conducting wire through which the conduction path passes by matching the conduction path described by the conduction path data with the circuit symbol detected by the circuit symbol detection unit and the conducting wire detected by the conducting wire detection unit.

2. The work support device according to claim 1, wherein the line detection unit detects the straight line from the geometric information described by the first circuit drawing data, or detects the straight line by applying a line detection filter to the second circuit drawing data, and the circuit symbol detection unit detects the circuit symbol by using at least one of template matching, deep learning using an object detection model, or deep learning using both the object detection model and an object recognition model for the second circuit drawing data.

3. The work support device according to claim 1, further comprising:

a storage unit for storing detection area data designating at least one of a detection area to be processed to detect the straight line in the second circuit drawing data and a non-detection area other than the detection area, wherein the line detection unit detects the straight line from the detection area designated by the detection area data, or does not detect the straight line from the non-detection area designated by the detection area data.

4. The work support device according to claim 3, wherein the work support device further provides a control screen for inputting an instruction from a user to the work support device, and the control screen includes, a data designation section for inputting an instruction to select the first circuit drawing data, a detection area designation section for inputting an instruction for designating the detection area and the non-detection area, a terminal designation section for inputting an instruction for designating the work terminal, a transmission instruction section for inputting an instruction to transmit the first or second circuit drawing data to the work terminal, a reception instruction section for inputting an instruction to receive the conduction path data from the work terminal, and a progress display section that displays a work progress status of the worker based on an analysis result of the analysis unit.

5. The work support device according to claim 1, wherein the circuit symbol detection unit detects a character arranged within a predetermined distance from the circuit symbol on the second circuit drawing data and associates the character with the circuit symbol as attribute information of the circuit symbol, and the analysis unit presents the attribute information associated with each circuit symbol together with each circuit part through which the conduction path passes.

6. The work support device according to claim 1, wherein the line detection unit reclassifies the detected straight line of which a length is less than a first threshold value as a point and reclassifies the detected straight line of which the length is equal to or greater than the first threshold value as a straight line, the line detection unit reclassifies the reclassified straight line with a gap between two straight lines that is equal to or greater than a second threshold value as solid lines and reclassifies the reclassified straight lines with the gap between two straight lines that is less than the second threshold value as dashed lines, the line detection unit reclassifies the reclassified dashed lines into any of dashed lines, one-dot chain lines, and two-dot chain lines according to a number of points existing within the gap, and when the reclassified points are arranged on a same straight line with a gap equal to or less than a third threshold value, the line detection unit reclassifies the points arranged on the straight line as a dotted line.

7. The work support device according to claim 6, wherein the circuit symbol detection unit detects a character placed within a predetermined distance from the circuit symbol on the second circuit drawing data and surrounded by a dashed line and associates the character with the circuit symbol as attribute information of the circuit symbol, and the analysis unit presents the attribute information associated with each circuit symbol together with each circuit part through which the conduction path passes.

8. The work support device according to claim 1, further comprising:

a structuring unit for structuring the circuit symbol on the second circuit drawing data and the conducting wire on the second circuit drawing data according to a connection relationship, and the analysis unit uses a structuring result by the structuring unit to specify each circuit part and the conducting wire through which the conduction path passes.

9. The work support device according to claim 8, wherein the structuring unit implements the structuring so that the circuit symbol excluding the conducting wire and the conducting wire are alternately connected.

10. The work support device according to claim 8, wherein the structuring unit creates a circuit element list enumerating circuit elements formed by circuit symbols and conducting wires connected to the circuit symbols, the structuring unit creates a start point list enumerating one or more of the circuit elements enumerated in the circuit element list that are connected one-to-one between the circuit symbol and the conducting wire, the structuring unit specifies, among the circuit elements enumerated in the circuit element list, the circuit elements that have a same conducting wire and do not have the same circuit symbol as the circuit elements enumerated in the start point list, the structuring unit updates the circuit elements enumerated in the start point list by connecting the circuit elements enumerated in the start point list and the specified circuit elements with the same conducting wire, and the structuring unit executes the structuring using the updated start point list.

11. The work support device according to claim 10, wherein when a plurality of input/output relationships formed by at least one of a conducting wire that inputs a signal to a circuit part and a conducting wire that outputs a signal from the circuit part exist in one circuit part, the structuring unit enumerates the circuit elements for each input/output relationship in the circuit element list.

12. The work support device according to claim 8, wherein when a same circuit part exists in a connection path between the circuit part and the conducting wire formed by the structuring, the structuring unit deletes the connection path from the structuring result.

13. The work support device according to claim 1, wherein when the conducting wire detection unit detects two or more conducting wires forming one path by making ends in contact with each other, the two or more conducting wires are treated as one conducting wire.

14. A work support system, comprising:

the work support device according to claim 1; and the work terminal that receives the first or second circuit drawing data from the work support device.

15. A non-transitory computer-readable medium storing an analysis program that causes a computer to execute processing for analyzing circuit drawing data showing a connection relationship of circuit parts, wherein the circuit drawing data is configured to represent, by a pixel, a figure describing a respective circuit part of the circuit parts, the analysis program causes the computer to execute steps of a) detecting a straight line from an image area of the circuit drawing data;

b) detecting a circuit symbol excluding a conducting wire from the image area of the circuit drawing data;

c) detecting, as a conducting wire, a remainder excluding the circuit symbol detected in step b) from the straight line detected in step a); and d) structuring the circuit symbols on the circuit drawing data and the conducting wire on the circuit drawing data according to the connection relationship, and in the step d), the analysis program causes the computer to perform the structuring so that the circuit symbols excluding the conducting wires and the conducting wires are alternately connected.

* * * * *